US008538350B2

(12) United States Patent
Varjonen et al.

(10) Patent No.: US 8,538,350 B2
(45) Date of Patent: Sep. 17, 2013

(54) ANTENNA ARRANGEMENT AND TEST METHOD

(75) Inventors: Eero Oskari Varjonen, Turku (FI); Shu Liu, Beijing (CN)

(73) Assignee: Nokia Corporation, Espoo (FI)

( * ) Notice: Subject to any disclaimer, the term of this patent is extended or adjusted under 35 U.S.C. 154(b) by 529 days.

(21) Appl. No.: 12/935,652

(22) PCT Filed: Mar. 31, 2008

(86) PCT No.: PCT/EP2008/053848
§ 371 (c)(1),
(2), (4) Date: Oct. 25, 2010

(87) PCT Pub. No.: WO2009/121394
PCT Pub. Date: Oct. 8, 2009

(65) Prior Publication Data
US 2011/0037667 A1    Feb. 17, 2011

(51) Int. Cl.
*H03C 1/62*     (2006.01)
*H04B 17/00*    (2006.01)
(52) U.S. Cl.
USPC .................................. 455/115.2; 455/226.1

(58) Field of Classification Search
USPC ............... 455/107, 115.1, 115.2, 129, 226.1, 455/226.2; 324/600, 702; 343/702, 703
See application file for complete search history.

(56) References Cited

U.S. PATENT DOCUMENTS

| | | | |
|---|---|---|---|
| 5,710,984 A * | 1/1998 | Millar et al. | 455/80 |
| 5,832,372 A * | 11/1998 | Clelland et al. | 455/115.2 |
| 6,215,448 B1 | 4/2001 | DaSilva et al. | 343/703 |
| 8,244,234 B2 * | 8/2012 | Zhu et al. | 455/423 |
| 2006/0094458 A1 | 5/2006 | Kitaji | 455/522 |
| 2006/0139217 A1 | 6/2006 | Vance | 343/702 |
| 2006/0234657 A1 | 10/2006 | Boyle | 455/129 |

OTHER PUBLICATIONS

Lighthart, L.P., "Multi-Band Antennas with Integrated Circuitry in Mobile Phones", IRCTR-DELFT University, Leat Sophia Antipolis, Jun. 5, 52 pgs.

* cited by examiner

*Primary Examiner* — Nguyen Vo
(74) *Attorney, Agent, or Firm* — Harrington & Smith (57) ABSTRACT

A method including providing a matching circuit, a first contact connected, without an intervening test connector to a transmitter and/or a receiver, and a second contact, separate from the first contact, connected to the matching circuit; sensing a parameter of the transmitter and/or the receiver by connecting test apparatus to the first contact; and providing an antenna element for coupling with the first contact and the second contact.

19 Claims, 6 Drawing Sheets

# ANTENNA ARRANGEMENT AND TEST METHOD

FIELD OF THE INVENTION

Embodiments of the present invention relate to antenna arrangements. In particular, they relate to antenna arrangements in mobile cellular telephones.

BACKGROUND TO THE INVENTION

Portable electronic devices such as mobile cellular telephones usually include a transmitter and/or a receiver and an antenna arrangement for wireless communications. During manufacture, it may be desirable to test parameters of the transmitter and/or the receiver to determine whether they meet predefined standards.

For example, one parameter which may be tested is the transmission power levels of a transmitter. In various radio frequency protocols, the output power of a signal from a transmitter depends on the distance between the communicating devices. As the distance increases between the devices, the output power of the signal from the transmitter increases in increments. Since many radio frequency communication service providers (e.g. mobile cellular telephone service providers) require the output power levels to be at predetermined levels, it may be useful to sense the output from the transmitter during manufacturing and then adjust the output power levels if necessary.

In order to carry out the above tests, a test connector (e.g. a coaxial switch connector) is provided between the transmitter and/or the receiver and the antenna element and matching circuitry. During testing, a radio frequency (RF) probe may be connected to the test connector in order to measure a parameter of the output from the transmitter and/or receiver. However, test connectors have an associated financial cost and are not usually used after the portable electronic device has been manufactured. In particular, coaxial switch connectors are relatively expensive and may increase the cost of a device in which they are fitted.

Therefore, it would be desirable to provide an alternative antenna arrangement.

BRIEF DESCRIPTION OF VARIOUS EMBODIMENTS OF THE INVENTION

According to various embodiments of the invention there is provided a method comprising: providing a matching circuit, a first contact connected, without an intervening test connector, to a transmitter and/or a receiver, and a second contact, separate from the first contact, connected to the matching circuit; sensing a parameter of the transmitter and/or the receiver by connecting test apparatus to the first contact; and providing an antenna element for coupling with the first contact and the second contact.

The method may further comprise connecting the second contact to ground via the matching circuit to provide a ground arm for the antenna element.

The method may further comprise connecting the second contact to ground via the matching circuit to provide an impedance match for the antenna element. This may provide an advantage if the antenna element has an impedance (e.g. not 50 Ohms) which is different to that of the first contact (e.g. 50 Ohms).

The method may further comprise providing a connector. The method may further comprise connecting the antenna element to the first contact and to the second contact via the connector.

The connector may comprise a single contact and the method may further comprise connecting the single contact of the connector to the first contact and to the second contact.

The connector may comprise a third contact and a fourth contact. The method may further comprise connecting the third contact of the connector to the first contact and connecting the fourth contact of the connector to the second contact.

The connector may be integral with the antenna element.

The connector may be removable from the antenna element. The connector may be removable from the first contact and the second contact.

The method may further comprise providing a sixth contact, connected between the first contact and the second contact. The antenna element may be configured to connect to the second contact and to couple to the first contact via the sixth contact. The method may further comprise connecting the sixth contact to the first contact after sensing a parameter of the transmitter and/or the receiver.

The method may further comprise connecting the matching circuit between the first contact and the sixth contact.

The method may further comprise connecting the matching circuit between the second contact and ground to provide a ground arm for the antenna element.

The method may further comprise connecting the second contact to ground via the matching circuit to provide an impedance match for the antenna element. This may provide an advantage if the antenna element has an impedance (e.g. not 50 Ohms) which is different to that of the first contact (e.g. 50 Ohms).

The method may further comprise configuring the first contact to have a predetermined impedance. The method may further comprise configuring the matching circuit to provide the antenna element with an impedance substantially equal to the predetermined impedance.

According to various embodiments of the invention there is provided an antenna arrangement comprising: a matching circuit; a first contact connected, without an intervening test connector, to a transmitter and/or a receiver; a second contact, separate from the first contact, connected to the matching circuit; an antenna element configured to couple with the first contact and the second contact, the first contact being connectable to test apparatus for sensing a parameter of the transmitter and/or the receiver.

The first contact may be connectable to test apparatus during manufacture.

The second contact may be connected to ground via the matching circuit and may be configured to provide a ground arm for the antenna element.

The second contact may be connected to ground via the matching circuit and may be configured to provide an impedance match for the antenna element. This may provide an advantage if the antenna element has an impedance (e.g. not 50 Ohms) which is different to that of the first contact (e.g. 50 Ohms).

The antenna arrangement may further comprise a connector. The antenna element may be configured to connect to the first contact and to the second contact via the connector.

The connector may comprise a single contact for connecting to the first contact and to the second contact.

The connector may comprise a third contact for connecting to the first contact and a fourth contact for connecting to the second contact.

The connector may be integral with the antenna element.

The connector may be removable from the antenna element. The connector may be removable from the first contact and the second contact.

The antenna arrangement may further comprise a sixth contact, connected between the first contact and the second contact. The antenna element may be configured to connect to the second contact and to couple to the first contact via the sixth contact. The connection between the sixth contact and the first contact may be made after sensing a parameter of the transmitter and/or the receiver.

The matching circuit may be connected between the first contact and the sixth contact.

The matching circuit may be connected between the second contact and ground and may be configured to provide a ground arm for the antenna element.

The second contact may be connected to ground via the matching circuit and may be configured to provide an impedance match for the antenna element. This may provide an advantage if the antenna element has an impedance (e.g. not 50 Ohms) which is different to that of the first contact (e.g. 50 Ohms).

The first contact may be configured to have a predetermined impedance. The matching circuit may be configured to provide the antenna element with an impedance substantially equal to the predetermined impedance.

According to various embodiments of the present invention, there is provided an apparatus comprising an antenna arrangement as described in any of the preceding paragraphs.

The apparatus may be for wireless communications.

According to various embodiments of the present invention, there is provided a portable electronic device comprising an antenna arrangement as described in any of the preceding paragraphs.

BRIEF DESCRIPTION OF THE DRAWINGS

For a better understanding of various embodiments of the present invention reference will now be made by way of example only to the accompanying drawings in which.

DETAILED DESCRIPTION OF VARIOUS EMBODIMENTS OF THE INVENTION

Figure 1:
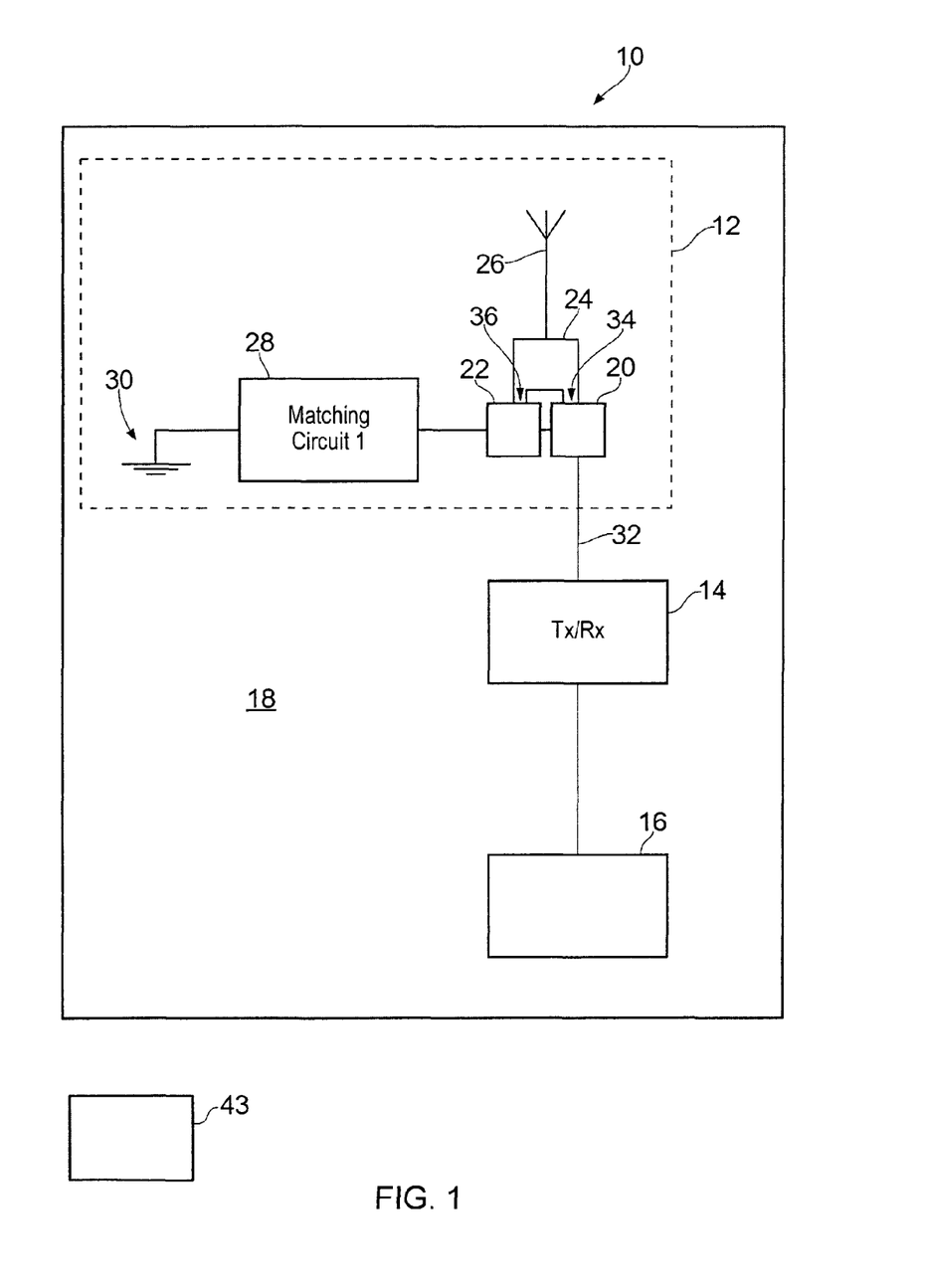
FIG. 1 illustrates a schematic diagram of an apparatus including an antenna arrangement according to various embodiments of the present invention.
Figure 5:
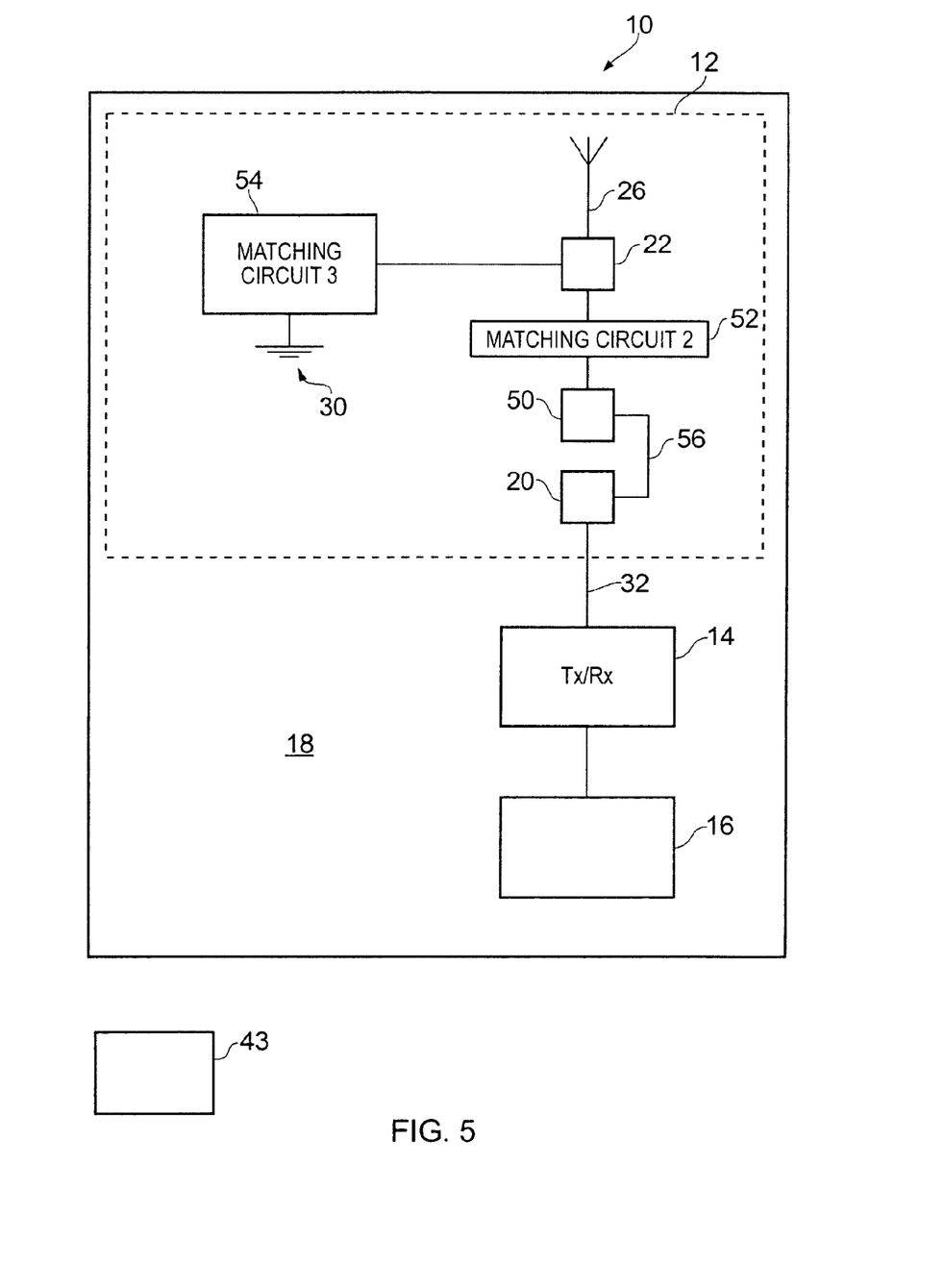
FIG. 5 illustrates a schematic diagram of an apparatus including an antenna arrangement according to various embodiments of the present invention.

FIGS. 1 and 5 illustrate an antenna arrangement 12 comprising: a matching circuit 28, 52; a first contact 20 connected, without an intervening test connector, to a transmitter and/or a receiver 14; a second contact 22, separate from the first contact 20, connected to the matching circuit 28, 52; an antenna element 26 configured to couple with the first contact 20 and the second contact 22, the first contact 20 being connectable to test apparatus 43 for sensing a parameter of the transmitter and/or the receiver 14.

In more detail, FIG. 1 illustrates an apparatus 10 such as a portable electronic device (for example, a mobile cellular telephone or a personal digital assistant), a cellular base station, other radio communication device or module for such devices.

In the following description, the wording 'connect' and 'couple' (and their derivatives) are used. It should be appreciated that the word 'connect' means a galvanic electrical connection between two electronic components which may or may not include one or more intervening electronic components. It should also be appreciated that the word 'couple' means a galvanic electrical connection and/or an electromagnetic connection (which may be inductive or capacitive or a combination of both) between two electronic components which may or may not include one or more intervening electronic components. The connections and couplings between electronic components may be made by electrically conductive material such as metal (e.g. copper wire).

The apparatus 10 comprises an antenna arrangement 12, a transmitter and/or a receiver 14 and functional circuitry 16. The antenna arrangement 12 is connected to the functional circuitry 16 via the transmitter and/or the receiver 14. Where reference numeral 14 denotes a transmitter only, the functional circuitry 16 is operable to provide signals to the transmitter 14 for transmission by the antenna arrangement 12. Where the reference numeral 14 denotes a receiver only, the functional circuitry 16 is operable to receive signals from the antenna arrangement 12 via the receiver 14. Where reference numeral 14 denotes a transceiver, the functional circuitry 16 is operable to transmit signals to, and receive signals from the transceiver 14.

In the embodiment where the apparatus 10 is a mobile cellular telephone, the functional circuitry 20 may include a processor, a memory and input/output devices such as a microphone, a loudspeaker and a display. The electronic components that provide the antenna arrangement 12, the transmitter and/or the receiver 14 and the functional circuitry 16 are interconnected via a printed wiring board (PWB) 18. In various embodiments the PWB 18 may be used as a ground plane for the antenna arrangement 12.

In this embodiment, the antenna arrangement 12 includes a first contact 20, a second contact 22, a connector 24, an antenna element 26 and a first matching circuit 28. The first contact 20 is electrically connected to the transmitter and/or the receiver 14 without an intervening test connector via connection 32 (i.e. the connection 32 does not include a test connector). Consequently, the first contact 20 may be directly electrically connected to the transmitter and/or the receiver 14. The connection 32 may be a transmission line for example. The second contact 22 is electrically connected to the first matching circuit 28 which may in turn be electrically connected to ground 30. The antenna element 26 may be coupled to the first contact 20 and to the second contact 22 via the connector 24. In other embodiments, the antenna element 26 may be directly electrically connected to the first contact 20 and to the second contact 22 without an intervening connector 24, i.e. the antenna element 26 may include one or more contacts which physically touch the first contact 20 and the second contact 22.

The first contact 20 and the second contact 22 comprise an electrically conductive material and are attached to the PWB 18. For example, the first contact 20 and the second contact 22 may comprise a metal such as copper and may be attached to the PWB 18 via adhesive. The first contact 20 is physically separate from the second contact 22 and when they are not connected to the antenna element 26 and/or the connector 24, the first contact 20 and the second contact 22 are electrically isolated from one another (i.e. there is no galvanic connection between them and they are therefore not electrically connected to one another). The first contact 20 and the second contact 22 may be positioned relatively close to one another (i.e. they may be separated by a distance of less than 7 mm, and in various embodiments, they may be separated by a distance of less than 1 mm) and may consequently only occupy a relatively small surface area on the PWB 18.

The antenna element 26 may be any suitable antenna element for the apparatus 10. For example, the antenna element 26 may be (but is not limited to) a planar inverted F antenna (PIFA), an inverted F antenna (IFA), a planar inverted L antenna (PILA), an inverted L antenna (ILA), a monopole antenna, a dipole antenna, a loop antenna, a helical antenna or a whip antenna. The antenna element 26 may include a single contact or a plurality of contacts for connecting to the connector 24 or to the first and second contacts 20, 22.

The antenna element 26 may be operable to efficiently transmit and receive radio frequency signals in any operational radio frequency band or according to any radio frequency protocol. For example, the antenna element 26 may be operable in any one or more of the following operational frequency bands and protocols: AM radio (0.535-1.705 MHz); FM radio (76-108 MHz); Bluetooth (2400-2483.5 MHz); WLAN (2400-2483.5 MHz); HLAN (5150-5850 MHz); GPS (1570.42-1580.42 MHz); US-GSM 850 (824-894 MHz); EGSM 900 (880-960 MHz); EU-WCDMA 900 (880-960 MHz); PCN/DCS 1800 (1710-1880 MHz); US-WCDMA 1900 (1850-1990 MHz); WCDMA 2100 (Tx: 1920-1980 MHz Rx: 2110-2180 MHz); PCS1900 (1850-1990 MHz); UWB Lower (3100-4900 MHz); UWB Upper (6000-10600 MHz); DVB-H (470-702 MHz); DVB-H US (1670-1675 MHz); DRM (0.15-30 MHz); WiMax (2300-2400 MHz, 2305-2360 MHz, 2496-2690 MHz, 3300-3400 MHz, 3400-3800 MHz, 5250-5875 MHz); DAB (174.928-239.2 MHz, 1452.96-1490.62 MHz); RFID LF (0.125-0.134 MHz); RFID HF (13.56-13.56 MHz); RFID UHF (433 MHz, 865-956 MHz, 2450 MHz). It should be appreciated that the antenna element 26 may be operable in operational frequency bands and protocols different to those mentioned in the above list. An operational frequency band is a frequency range over which an antenna can efficiently operate. Efficient operation occurs, for example, when the antenna element's 26 insertion loss S11 is greater than an operational threshold such as 4 dB or 6 dB.

Figure 2:
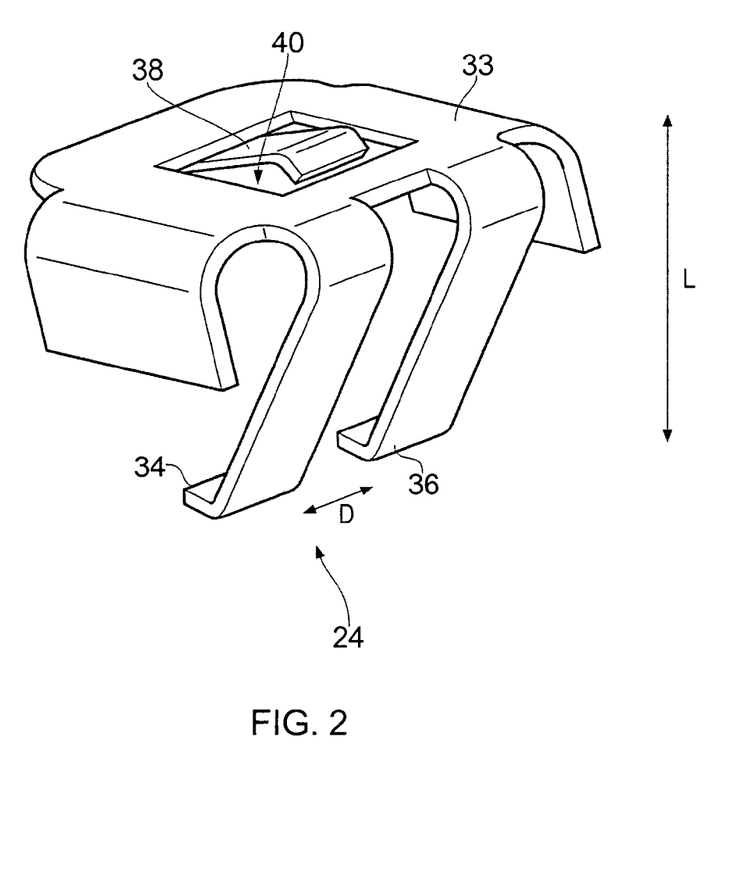
FIG. 2 illustrates a perspective view of a connector according to one embodiment of the present invention.

The connector 24 may comprise any suitable conductive material and in various embodiments may comprise a metal such as copper. With reference to FIGS. 1 and 2, the connector 24 may comprise a body portion 33, a third contact 34 which is configured to connect to the first contact 20 of the antenna arrangement 12, and a fourth contact 36 which is configured to connect to the second contact 22 of the antenna arrangement 12. When the connector 24 is connected to the first and second contacts 20, 22, the body portion 33 is oriented substantially parallel with the PWB 18, and the third contact 34 and the fourth contact 36 extend downwardly from the body portion 33 in order to contact the first and second contacts 20, 22.

In this embodiment, the third contact 34 and the fourth contact 36 are relatively short (with a length L which may be less than 6 mm, and in various embodiments with a length L less than 2 mm) and positioned relatively close together (with a separation D of less than 7 mm, and in various embodiments, with a separation D of less than 1 mm). Consequently, when the connector 24 is connected to the first and second contacts 20, 22, it may be configured to provide a conductive bridge between the first contact 20 and the second contact 22 which may appear electrically as a single contact connecting the first contact 20 and the second contact 22. The third and fourth contacts 34, 36 may be resilient in order to make better contact with the first and second contacts 20, 22 of the antenna arrangement 12. The length L and the separation D of the third contact 34 and the fourth contact 36 may only be determined from the dimensions required to maintain working mechanical spring action and may not be determined to provide the antenna element 26 with a particular electrical length. In the embodiment illustrated in FIG. 2, the third and fourth contacts 34, 36 are C shaped resilient clips. However, it should be appreciated that in other embodiments, the third and fourth contact 34, 36 may be pogo pins or have any other suitable structure.

The connector 24 also includes a fifth contact 38 which is configured to receive and electrically connect to the antenna element 26. In the embodiment illustrated in FIG. 2, the body portion 33 includes an aperture 40 for receiving the antenna element 26 and the fifth contact 38 extends from the periphery of the aperture 40 into the aperture 40. The fifth contact 38 may be resilient to ensure a better electrical connection to the antenna element 26.

Figure 3:
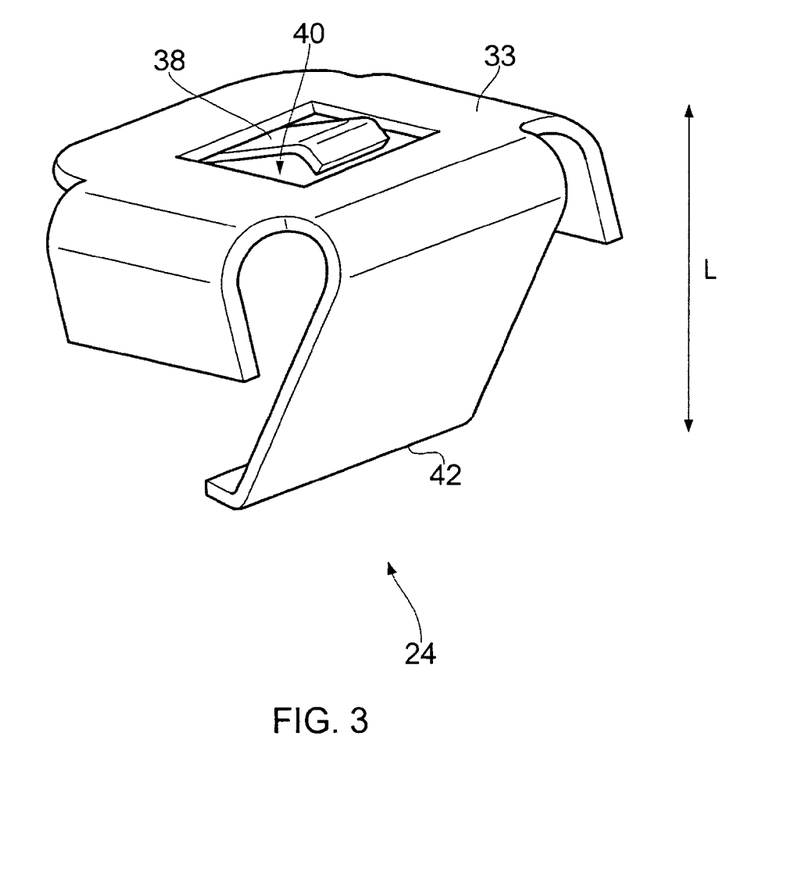
FIG. 3 illustrates a perspective view of a connector according to another embodiment of the present invention.

FIG. 3 illustrates a perspective view of another embodiment of a connector 24. The connector 24 illustrated in FIG. 3 is similar to the connector illustrated in FIG. 2 and where the features are similar, the same reference numerals are used. In this embodiment, the connector 24 includes a single contact 42 for connecting to the first contact 20 and to the second contact 22 of the antenna arrangement 12. Consequently, the connector 24 provides an electrical bridge between the first contact 20 and the second contact 22 when it is connected thereto.

The connector 24 may be a physically separate structure to the antenna element 26 and to the first and second contacts 20, 22 as illustrated in FIGS. 2 and 3. In this embodiment, the connector 24 is attached to the first contact 20, the second contact 22 and the antenna element 26 during manufacturing (e.g. with solder or by mechanical constraints). Alternatively, the connector 24 may be integral with the antenna element 26 and together they may be a single structure (e.g. they may both be formed from the same piece of continuous material such as sheet metal).

The first contact 20 has a predetermined impedance (e.g. fifty Ohms). This may be determined, at least in part, by the impedance of the connection 32 (which may be a fifty Ohm transmission line).

The first matching circuit 28 is configured to adjust the impedance of the antenna element 26 (either when connected directly to the first and second contacts 20, 22 or via the connector 24) so that it substantially equals the predetermined impedance of the first contact 20 when operating in a first radio frequency band. Matching circuits are well known in the art and will consequently not be discussed in detail here. However, it should be appreciated that the first matching circuit 28 may include any suitable combination and arrangement of reactive components such as inductors, capacitors and transmission lines.

Since the impedance of the antenna element 26 when operating in the first frequency band (when coupled to the first matching circuit 28) substantially matches the impedance of the first contact 20, radio frequency signals in the first frequency band are not substantially reflected at the first contact 20 and antenna element 26 or connector 24 interface. Consequently, the apparatus 10 is able to efficiently transmit and receive radio frequency signals in the first frequency band.

In the embodiment where the first matching circuit 28 is connected to ground 30, the combined second contact 22, first matching circuit 28 and ground 30 electrical path may provide a ground arm for the antenna element 26. Consequently, the antenna element 26 may not require a ground leg which extends from the body of the antenna element 26 to the PWB 18. This may provide an advantage in that it may reduce the volume of space required by the antenna element 26. Additionally, since the ground arm is located on the PWB 18, the first contact 20 and the second contact 22 may be positioned relatively close to one another (as mentioned above) and require a relatively small surface area on the PWB 18.

It should be appreciated that a "ground arm" may be a ground arm located on the printed wiring board surface instead of being implemented in a feed leg arrangement. A ground arm may be implemented in a similar way as for a feed leg (a feed leg is the leg which feeds the RF signals into and from the antenna element) and is usually called a ground leg. Such ground legs are typically used in many planar antenna types and some non-planar antenna types, e.g. PIFA's, IFA's, etc and they may be substantially perpendicular to the printed wiring board surface, as opposed to being in the same plane as the printed wiring board conductive tracks. However, a ground arm may also be a route to ground potential via some impedance transformation, for example, when using a shunt matching circuit. It should be appreciated that the arrangement where the ground arm combined with reactive elements, for example capacitance and/or inductive reactances, located on the printed wiring board surface is not the same as a ground leg as used in a PIFA (Planar Inverted-F Antenna) or other antenna types where a direct ground connection is required as part of the antenna design.

In various embodiments of the present invention, the first matching circuit 28 (e.g. a shunt inductor) may provide an impedance match for the antenna element 26. This may be advantageous when the antenna element 26 has an impedance which is not substantially equal to 50 Ohms.

Figure 4:
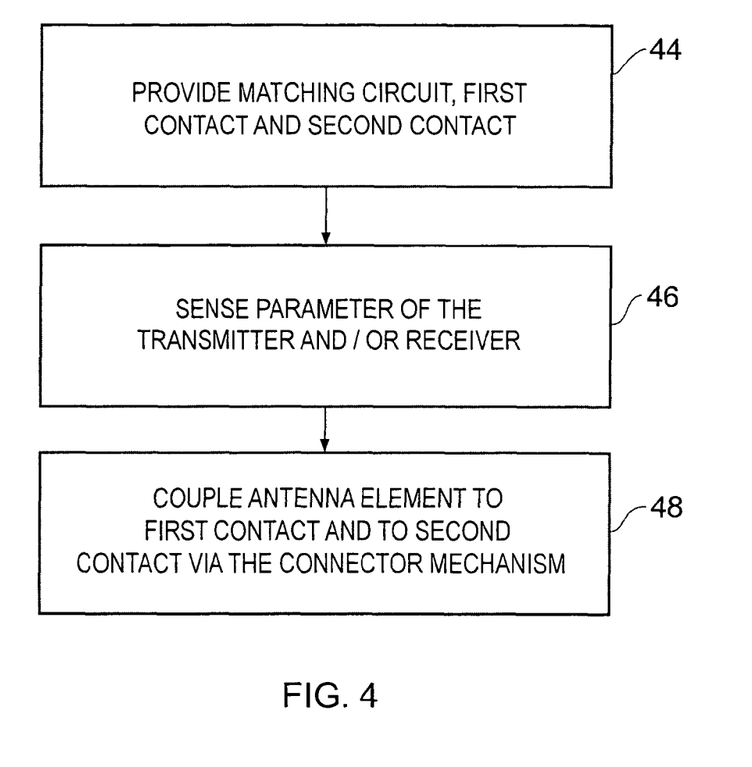
FIG. 4 illustrates a flow diagram of a method for manufacturing the apparatus illustrated in FIG. 1.

FIG. 4 illustrates a flow diagram of a method for manufacturing an apparatus 10 according to various embodiments of the present invention. Reference is made to the apparatus 10 illustrated in FIG. 1, but it should be appreciated that the method is not limited to the manufacture of this apparatus alone and may be applicable to other apparatus according to embodiments of the present invention.

In block 44, the first contact 20, the second contact 22 and the first matching circuit 28 are provided. The first contact 20 is connected to the transmitter and/or the receiver 14, with no intervening test connector, and the second contact 22 is connected to the first matching circuit 28. The first matching circuit 28 may also be connected to ground 30.

In block 46, test apparatus 43 is connected to the first contact 20 so that a parameter of the transmitter and/or the receiver 14 may be sensed. For example, one parameter which may be sensed by the test apparatus 43 is the transmission power levels of the transmitter 14. In various radio frequency protocols, the output power of a signal from the transmitter 14 depends on the distance between the apparatus 10 and the device which it is communicating with. As the distance increases between the apparatus 10 and the communicating device, the output power of the signal from the transmitter 14 increases in increments. Since many radio frequency communication service providers (e.g. mobile cellular telephone service providers) require the output power levels to be at predetermined levels, it is useful to sense the output from the transmitter 14 and then adjust the output power levels if necessary. This may be done during manufacture of the apparatus 10 to ensure that the apparatus 10 meets the required power levels demanded by the radio protocol standard (e.g. EGSM). This is called 'power level alignment' and the power levels are required to meet a certain power level within a pre-specified tolerance (e.g. power level 1=+24 dBm+/−0.5 dB)

In a further example, one parameter which may be sensed by the sensor is the receive sensitivity of the receiver 14. In various radio frequency protocols, the received power of a signal received by the antenna 26 and it's receiver circuitry must be sufficient enough in order for the apparatus to make the communication with a base station, for example. The receive sensitivity is one example of a receiver parameter which may be tested to give an indication of how well the receiver (not the antenna) is performing before it leaves the factory. Receive sensitivity is a measure of the minimum wanted signal at a receiver's input needed to give the minimum signal level and the minimum signal to noise ratio at the demodulator input. It is usually measured in dBm, and for example a figure of the order of −90 dBm may be considered to be acceptable (this is dependent on the radio protocol).

For example, for a digital modulation scheme, the receive sensitivity may be measured by injecting a known signal (carrier) with digital modulation into the receiver and the Bit Error Rate (BER) is measured. As long as the BER is within a required threshold, the apparatus under test passes the test. If it is above the limit for BER, then the values stored in memory may be adjusted in order to re-align the receiver 14.

Since many radio frequency communication service providers (e.g. mobile cellular telephone service providers) require the receiver 14 to meet a minimum performance level, it is necessary to ensure that the product leaves the factory with the required performance. It should be appreciated that the above mentioned test is only a test of how well the receiver circuitry works and does not include the overall receiver 14 performance (including the antenna and its matching circuitry). If the receiver 14 does not meet the required results during the production test, then there may be a problem with the circuitry and the apparatus 10 may be returned back to the manufacturing process before being re-tested and shipped to a customer.

In various embodiments, the test apparatus 43 may include a radio frequency (RF) probe which is configured to contact the first contact 20 and a ground point (not illustrated in FIG. 1). The impedance of the probe is substantially equal to the predetermined impedance of the first contact 20 (e.g. fifty Ohms). This may result in little or no signal reflections at the first contact 20 and probe interface and may help to improve the accuracy of the above mentioned transmitter and receiver tests.

In block 48, the antenna element 26 is coupled to the first contact 20 and to the second contact 22. As mentioned above, the antenna element 26 may include one or more contacts for connecting to the first and second contacts 20, 22 or may couple to the first and second contacts 20, 22 via the connector 24. The connection of the antenna element 26 results in the first and second contacts 20, 22 becoming electrically connected to one another via the antenna element 26 (and optionally the connector 24).

Embodiments of the present invention provide an advantage in that they do not require a dedicated test connector between the first contact 20 and the transmitter and/or receiver 14 because parameters of the transmitter and/or the receiver 14 can be sensed at the first contact 20 directly. Consequently, this may reduce the cost and the manufacturing complexity of the apparatus 10.

FIG. 5 illustrates a schematic diagram of an apparatus 10 including an antenna arrangement 12 according to various embodiments of the present invention. The apparatus 10 illustrated in FIG. 5 is similar to the apparatus illustrated in FIG.

1, and where the features are similar, the same reference numerals are used. The apparatus 10 illustrated in FIG. 5 differs from the apparatus illustrated in FIG. 1 in that it includes a sixth contact 50, a second matching circuit 52 and optionally, a third matching circuit 54.

The first contact 20 is electrically connected to the transmitter and/or receiver 14 via connection 32 which does not include a test connector. The sixth contact 50 is electrically connected to the first contact 20 via connection 56, and to the second matching circuit 52. The second matching circuit 52 is electrically connected to the second contact 22. The (optional) third matching circuit 54 is connected to the second contact 22 and to ground 30.

In this embodiment, the antenna element 26 is configured to directly electrically connect to the second contact 22 and to couple to the first contact 20 via the second contact 22, the second matching circuit 52, the sixth contact 50 and the connection 56. The antenna element 26 may be connected to the second contact 22 via a connector 24 (not illustrated in FIG. 5 for clarity purposes). Alternatively, the antenna element 26 may include a contact for directly connecting to second contact 22.

As in the embodiment illustrated in FIG. 1, the first contact 20 has a predetermined impedance (e.g. fifty Ohms). The second matching circuit 52 and optionally, the third matching circuit 54 may be configured to change the impedance of the antenna element 26 (as viewed at the first contact 20) to be substantially equal to the predetermined impedance.

Figure 6:
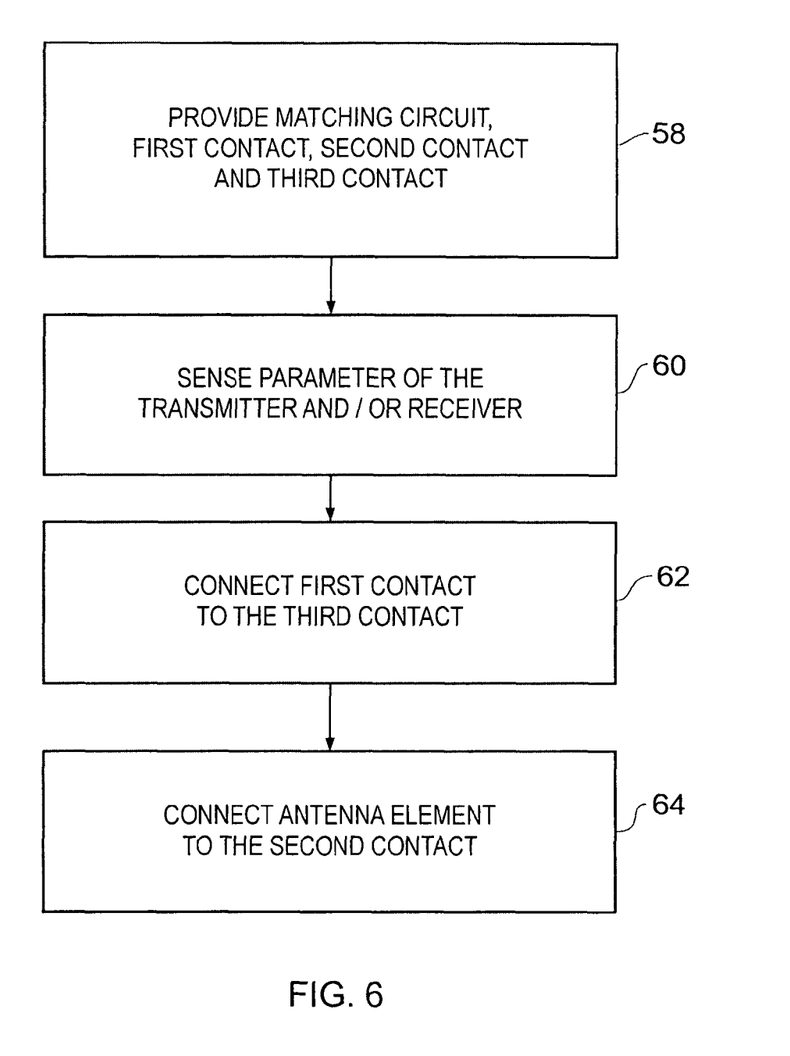
FIG. 6 illustrates a flow diagram of a method for manufacturing the apparatus illustrated in FIG. 5.

FIG. 6 illustrates a flow diagram of a method for manufacturing an apparatus 10 according to various embodiments of the present invention. Reference is made to the apparatus 10 illustrated in FIG. 5, but it should be appreciated that the method is not limited to the manufacture of this apparatus alone and may be applicable to other apparatus according to embodiments of the present invention.

At block 58, the second matching circuit 52, the first contact 20, the second contact 22, the sixth contact 50 and optionally, the third matching circuit 54 are provided. The first contact 20 is electrically connected to the transmitter and/or receiver 14 via connection 32. As mentioned above, the connection 32 does not include a test connector. The sixth contact 50 is electrically connected to the second contact 22 via the second matching circuit 52. Optionally, the second contact 22 is electrically connected to the third matching circuit 54. At this stage, the first contact 20 is not electrically connected to the sixth contact 50 or to the second contact 22 and is therefore electrically isolated from the second matching circuit 52, the second contact 22 and the third matching circuit 54.

At block 60, a test apparatus 43 is connected to the first contact 20 so that a parameter of the transmitter and/or the receiver 14 may be sensed (e.g. the transmission power levels of the transmitter 14). The impedance of the test apparatus 43 is substantially equal to the predetermined impedance of the first contact 20 (e.g. fifty Ohms). This may result in little or no signal reflections at the first contact 20 and test apparatus 43 interface and may help to improve the accuracy of the transmitter and receiver tests.

At block 62, the first contact 20 and the sixth contact 50 are electrically connected to one another via connection 56. At block 64, the antenna element 26 is electrically connected to the second contact 22.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
providing a matching circuit, a first contact connected, without an intervening test connector, to a transmitter and/or a receiver, and a second contact, separate from the first contact, connected to the matching circuit; the first contact and the second contact being configured to couple with an antenna element;
connecting the second contact to ground via the matching circuit to provide a ground arm for the antenna element; and
sensing a parameter of the transmitter and/or the receiver by connecting test apparatus to the first contact.

2. A method as claimed in claim 1, further comprising providing a connector, and connecting the antenna element to the first contact and to the second contact via the connector.

3. A method as claimed in claim 2, wherein the connector comprises a single contact and the method further comprising connecting the single contact of the connector to the first contact and to the second contact.

4. A method as claimed in claim 2, wherein the connector comprises a third contact and a fourth contact, and the method further comprises connecting the third contact of the connector to the first contact and connecting the fourth contact of the connector to the second contact.

5. A method as claimed in claim 2, wherein the connector is integral with the antenna element.

6. A method as claimed in claim 2, wherein the connector is removable from the antenna element and from the first contact and the second contact.

7. A method as claimed in claim 1, further comprising providing a sixth contact, connected between the first contact and the second contact, the antenna element being configured to connect to the second contact and to couple to the first contact via the sixth contact; and connecting the sixth contact to the first contact after sensing a parameter of the transmitter and/or the receiver.

8. A method as claimed in claim 7, further comprising connecting the matching circuit between the first contact and the sixth contact.

9. A method as claimed in claim 1, further comprising configuring the first contact to have a predetermined impedance and configuring the matching circuit to provide the antenna element with an impedance substantially equal to the predetermined impedance.

10. An apparatus comprising:
a matching circuit;
a first contact connected, without an intervening test connector, to a transmitter and/or a receiver, the first contact being connectable to test apparatus for sensing a parameter of the transmitter and/or the receiver;

a second contact, separate from the first contact and connected to the matching circuit;

the first contact and the second contact being configured to couple with an antenna element;

wherein the second contact is connected to ground via the matching circuit and is configured to provide a ground arm for the antenna element.

11. An apparatus as claimed in claim 10, further comprising a connector, wherein the antenna element is configured to connect to the first contact and to the second contact via the connector.

12. An apparatus as claimed in claim 11, wherein the connector comprises a single contact for connecting to the first contact and to the second contact.

13. An apparatus as claimed in claim 11, wherein the connector comprises a third contact for connecting to the first contact and a fourth contact for connecting to the second contact.

14. An apparatus as claimed in claim 11, wherein the connector is integral with the antenna element.

15. An apparatus as claimed in claim 11, wherein the connector is removable from the antenna element and from the first contact and the second contact.

16. An apparatus as claimed in claim 10, further comprising a sixth contact, connected between the first contact and the second contact, the antenna element being configured to connect to the second contact and to couple to the first contact via the sixth contact, wherein the connection between the sixth contact and the first contact is made after sensing a parameter of the transmitter and/or the receiver.

17. An apparatus as claimed in claim 16, wherein the matching circuit is connected between the first contact and the sixth contact.

18. An apparatus as claimed in claim 10, wherein the first contact is configured to have a predetermined impedance and the matching circuit is configured to provide the antenna element with an impedance substantially equal to the predetermined impedance.

19. A portable electronic device comprising an apparatus as claimed in claim 10.

* * * * *